(12) United States Patent
Zhao

(10) Patent No.: US 8,217,579 B2
(45) Date of Patent: Jul. 10, 2012

(54) DEVICE AND METHOD FOR CONTROLLING DC BIAS OF RF DISCHARGE SYSTEM

(75) Inventor: Yi Zhao, Beijing (CN)

(73) Assignee: Beijing NMC Co. Ltd., Beijing (CN)

( * ) Notice: Subject to any disclaimer, the term of this patent is extended or adjusted under 35 U.S.C. 154(b) by 254 days.

(21) Appl. No.: 12/746,480

(22) PCT Filed: Feb. 3, 2008

(86) PCT No.: PCT/CN2008/070261
§ 371 (c)(1),
(2), (4) Date: Jun. 4, 2010

(87) PCT Pub. No.: WO2009/070986
PCT Pub. Date: Jun. 11, 2009

(65) Prior Publication Data
US 2010/0283446 A1    Nov. 11, 2010

(30) Foreign Application Priority Data
Dec. 6, 2007    (CN) .......................... 2007 1 0178857

(51) Int. Cl.
*H03F 3/04* (2006.01)
*H05B 31/26* (2006.01)
(52) U.S. Cl. ............................... 315/111.21; 315/111.31
(58) Field of Classification Search ............. 315/111.21, 315/111.31; 204/298.08, 298.06, 292.1, 204/192.33
See application file for complete search history.

(56) References Cited

U.S. PATENT DOCUMENTS

| 6,031,198 A * | 2/2000 | Moriyama et al. ....... 219/121.57 |
| 7,224,230 B2 | 5/2007 | Apel et al. |
| 7,274,258 B2 | 9/2007 | Wang |

FOREIGN PATENT DOCUMENTS

| CN | 1551486 A | 12/2004 |
| EP | 1863172 A2 | 12/2007 |
| JP | 2004221737 A | 8/2004 |
| WO | WO2009070986 A1 | 6/2009 |

OTHER PUBLICATIONS

International Search Report, PCT/CN2008/070261 mailed Sep. 11, 2008.

* cited by examiner

*Primary Examiner* — Daniel D Chang
(74) *Attorney, Agent, or Firm* — Howard M. Gitten; Edwards Wildman Palmer LLP

(57) ABSTRACT

The present invention provides a device and a method for controlling a DC bias of a RF discharge system. Said device comprises a DC bias detection module (302), a mode selection module (301), a DC bias controlling module (303) and a RF power providing module (304). The mode selection module (301) receives a parameter and a type of the parameter. If the type of the parameter is representative of voltage, the DC bias controlling module (303) calculates a power value according to the voltage-related representative parameter and the detected DC bias value, and the RF power providing module (304) provides power according to the calculated power value. If the type of the parameter is representative of power, the RF power providing module (304) provides power according to the power-related representative parameter.

14 Claims, 5 Drawing Sheets

DEVICE AND METHOD FOR CONTROLLING DC BIAS OF RF DISCHARGE SYSTEM

CROSS REFERENCES TO RELATED APPLICATIONS

This application is a U.S. national phase application pursuant to 35 U.S.C. §371, of PCT/CN2008/070261 filed Feb. 3, 2008, which claims priority to Chinese Patent Application No. 200710178857.2 filed Dec. 6, 2007. The entire contents of the aforementioned patent applications are incorporated herein by this reference.

BACKGROUND OF THE INVENTION

The present invention relates to a technical field of plasma etching, particularly to a device and a method for controlling a DC bias of a RF discharge system.

BRIEF SUMMARY OF THE INVENTION

Plasma etching technology is one of critical processes in integrated circuit manufacture, and its object is to duplicate a mask pattern onto a surface of a wafer. The general principle of the plasma etching technology is that at a low pressure, reactive gas is excited by a RF (radio frequency) power to be ionized and the ionized gas forms plasma. A DC (direct current) bias is formed between the plasma and the surface of the wafer placed on a bottom electrode, and positive ions of the plasma and active reactive groups are further attracted by the DC bias to speed up bombarding the wafer surface, thereby accelerating chemical reaction on the surface of the wafer and increasing etching velocity. The DC bias as described herein is generally referred to as a DC self-bias as well.

The magnitude of the DC bias as described above can affect the energy of the positive ions and the active reactive groups while they are bombarding the surface of the wafer, and in turn influence some process parameters, such as etching velocity, deposition velocity, etc. In practice, in order to achieve better process effects, the DC bias used in the plasma etching process should be controlled. The DC bias can be controlled in two methods, one of which is a power controlling method, the other of which is a voltage controlling method.

FIG. 1 shows a schematic diagram of a device in which the power controlling method is used to control the DC bias. As shown in FIG. 1, the device can include a RF power supply 101 and a matching network 102. The RF power supply 101 is used to provide power, and the matching network 102 is used for matching load impedance so as to eliminate power reflection and is used for outputting the power provided by the RF power supply 101 to an electrode of the discharge system. The electrode of the discharge system as described herein can be either the top electrode of the discharge system or the bottom electrode of the discharge system.

That is, since the RF power supply 101 can provide the electrode of the discharge system with power through the matching network 102, the DC bias can be indirectly controlled as long as the power output by the RF power supply 101 can be controlled, so that the process flow is carried out according to preset process parameters.

FIG. 2 shows a schematic diagram of a device in which the voltage controlling method is used to control the DC bias. As shown in FIG. 2, the device includes a RF power providing module 201, a DC bias detection module 202 and a DC bias controlling module 203.

Wherein the RF power providing module 201 is used to provide the lower electrode of the discharge system with power according to the power value transmitted from the DC bias controlling module 203, and can Include a RF power supply 2011 and a matching network 2012, the functions of which are similar to those of the RF power supply 101 and the matching network 102 in FIG. 1, therefore the description of them is omitted herein.

The DC bias detection module 202 is used to detect the DC bias of the bottom electrode of the discharge system, and output the detected DC bias value to the DC bias controlling module 203. The DC bias detection module 202 can include a voltage sensor 2021 and an analog/digital conversion module 2022, wherein the voltage sensor 2021 is used to detect the DC bias of the bottom electrode of the discharge system and transmit the detected DC bias value to the analog/digital conversion module 2022 in the form of an analog signal; analog/digital conversion module 2022 is used to convert the DC bias value in the form of an analog signal into a DC bias value in the form of a digital signal and output it to the DC bias controlling module 203.

The DC bias controlling module 203 calculates a power value according to a DC bias controlling algorithm by utilizing the detected DC bias value and a preset DC bias value input, and outputs a signal carrying the calculated power value to the RF power providing module 201 so as to control the RF power providing module 201 to provide power according to this power value.

That is, the RF power providing module 201, the bottom electrode. of the discharge system, the DC bias detection module 202 and the DC bias controlling module 203 in FIG. 2, which can constitute a feedback loop, maintain the DC bias of the bottom electrode of the discharge system at a preset value by utilizing the DC bias controlling algorithm, so that the object of controlling the DC bias is achieved. Of course, in practice, if the RF power supply 2011 is a RF power supply that receives analog signals, a digital/analog conversion module is also required to be added between the DC bias controlling module 203 and the RF power supply 2011; if the DC bias controlling algorithm can't calculate directly according to the DC bias value transmitted from the DC bias detection module 202, a transformation and evaluation module is also required to be added between the DC bias detection module 202 and the DC bias controlling module 203, which is used to transform the detected DC bias value into a value that can be used to calculate by the DC bias controlling algorithm. The digital/analog conversion module and the transformation and evaluation module as described herein belong to the prior art, therefore the details are omitted.

Although the DC bias of the discharge system can be controlled by either the power controlling method or the voltage controlling method in the prior art, these methods are applied separately in general, and can't be selected flexibly according to the actual situation. For example, when a certain process flow is carried out by utilizing the voltage controlling method, if it is found out that there is a large difference between its processing result and a preset result, it is needed to be verified by utilizing the power controlling method. At this time, because the entire process flow is based on the device for controlling the DC bias as shown in FIG. 2, it is difficult to be transferred onto the device for controlling the DC bias as shown in FIG. 1 to be performed. As can be seen from this, the prior art can't satisfy the actual requirement of flexible conversion and selection between the power controlling method and the voltage controlling method.

SUMMARY OF THE PRESENT INVENTION

In view of that, the first object of the present invention is to provide a device for controlling a DC bias of a RF discharge system, and the device accommodates both the power controlling method and the voltage controlling method, thereby a flexible choice between the power controlling method and the power controlling method can be made.

The second object of the present invention is to provide a method for controlling a DC bias of a RF discharge system, and the method accommodates both the power controlling method and the voltage controlling method, thereby a flexible choice between the power controlling method and the power controlling method can be made.

In order to achieve the first object of the present invention, the technical solution proposed by the present invention is as follows:

a device for controlling a DC bias of a RF discharge system, comprising a mode selection module, a DC bias detection module, a DC bias controlling module and a RF power providing module;

said mode selection module is used for receiving input information including a parameter and a type of the parameter and judging the type of the parameter, if the type of the parameter is representative of being related to power, outputting the parameter as a power-related representative parameter to the RF power providing module; if the type of the parameter is representative of being related to voltage, outputting the parameter as a voltage-related representative parameter to the DC bias controlling module;

said DC bias detection module is used for detecting the DC bias of an electrode of the discharge system and outputting the detected DC bias value to the DC bias controlling module;

said DC bias controlling module is used for receiving the voltage-related representative parameter from the mode selection module and the DC bias value from the DC bias detection module; calculating the power value according to a DC bias controlling algorithm by utilizing said DC bias value and the voltage-related representative parameter, and outputting the calculated power value to the RF power providing module;

said RF power providing module is used for providing the electrode of the discharge system with power according to the power-related representative parameter upon receipt of the power-related representative parameter from the mode selection module; and providing the electrode of the discharge system with power according to the power value calculated by the DC bias controlling module upon receipt of the calculated power value.

In the above solution, the device further comprises:

a calibration module, positioned between said mode selection module and the RF power providing module, for storing a power calibration value obtained previously; updating the power-related representative parameter according to said power calibration value upon receipt of the power-related representative parameter from said mode selection module, and outputting the updated power-related representative parameter to said RF power providing module.

In the above solution, the device further comprises:

a fault detection module, positioned between said DC bias controlling module and the RF power providing module, for storing a range of normal power values obtained previously; judging whether the power value calculated by the DC bias controlling module exceeds the range of normal power values or not upon receipt of the calculated power value, and if so, outputting a fault alarm signal; otherwise, outputting the calculated power value to said RF power providing module.

In the above solution, said RF power providing module comprises:

a RF power supply, for providing power according to the power-related representative parameter upon receipt of the power-related representative parameter; and providing power according to the power value calculated by the DC bias controlling module upon receipt of the calculated power value;

a matching network, for matching load impedance, and outputting the power provided by the RF power supply to the electrode of the discharge system.

In the above solution, said RF power supply is a RF power supply that receives analog signals, the power-related representative parameter output to the RF power supply is carried in a digital signal, and the calculated power values output to the RF power supply is carried in a digital signal, and the device further comprises:

a digital/analog conversion module, for performing digital-to-analog conversion upon receipt of a digital signal carrying the power-related representative parameter, obtaining an analog signal carrying the power-related representative parameter and outputting the analog signal carrying the power-related representative parameter to the RF power supply; and performing digital-to-analog conversion upon receipt of a digital signal carrying the calculated power value, obtaining an analog signal carrying the calculated power value and outputting the analog signal carrying the calculated power value to the RF power supply.

In the above solution, said DC bias detection module comprises:

a voltage sensor, for detecting the DC bias of said electrode of the discharge system, and outputting the detected DC bias value in the form of an analog signal to an analog/digital conversion module;

the analog/digital conversion module, for converting the DC bias value in the form of an analog signal into a DC bias value in the form of a digital signal and outputting the DC bias value in the form of a digital signal to said DC bias controlling module.

In the above solution, the device further comprises:

a transformation and evaluation module, for receiving the DC bias value in the form of a digital signal from the analog/digital conversion module, converting the received DC bias value into a value that can participate in the calculation of the DC bias controlling algorithm, and outputting the converted DC bias value to the DC bias controlling module.

In order to achieve the second object of the present invention, the technical solution of the present invention is as follows:

a method for controlling a DC bias of a RF discharge system, comprising:

A. receiving input information including a parameter and a type of the parameter and judging the type of the parameter, if the type of the parameter is representative of being related to voltage, treating the parameter as a voltage-related representative parameter and performing step B; if the type of the parameter is representative of being related to power, treating the parameter as a power-related representative parameter and performing step C;

B. calculating a power value according to said voltage-related representative parameter, the DC bias value detected from the electrode of the discharge system and a DC bias controlling algorithm, and providing the electrode of the discharge system with power according to the calculated power value;

C. providing the electrode of the discharge system with power according to said power-related representative parameter.

In the above solution, between judging that the type of the parameter is representative of being related to power in the step A and the step C, the method further includes:

updating said power-related representative parameter according to a power calibration value stored previously.

In the above solution, between calculating the power value and providing the electrode of the discharge system with power according to the calculated power value in the step B, the method further includes:

judging whether the calculated power value exceeds the range of normal power values stored previously or not, and if so, outputting a fault alarm signal and exiting the present flow; otherwise, continuing performing the step of providing the electrode of the discharge system with power according to the calculated power value.

In the above solution, said providing the electrode of the discharge system with power according to the calculated power value in the step B particularly includes: a RF power supply provides power according to the calculated power value, and a matching network for matching load impedance outputs the power provided by the RF power supply to the electrode of the discharge system;

said providing the electrode of the discharge system with power according to the power-related representative parameter in the step C particularly includes: the RF power supply provides power according to said power-related representative parameter, and the matching network for matching load impedance outputs the power provided by the RF power supply to the electrode of the discharge system.

In the above solution, said RF power supply is a RF power supply that receives analog signals, said calculated power value is carried in a digital signal, said power-related representative parameter is carried in a digital signal, and between judging that the calculated power value does not exceed the range of power values stored previously and providing the electrode of the discharge system with power according to the calculated power value in the step B, the method further includes:

performing digital-to-analog conversion on a digital signal carrying the calculated power value, obtaining an analog signal carrying the calculated power value, and outputting the analog signal carrying the calculated power value to the RF power supply.

In the step C, before said providing the electrode of the discharge system with power according to the power-related representative parameter, the method further includes:

performing digital-to-analog conversion on a digital signal carrying the power-related representative parameter, obtaining an analog signal carrying the power-related representative parameter, and outputting the analog signal carrying the power-related representative parameter to the RF power supply.

In the above solution, said detecting the DC bias value from the electrode of the discharge system particularly includes:

a voltage sensor detects the DC bias of said electrode of the discharge system, an analog-to-digital conversion is performed on the detected DC bias value in the form of an analog signal, and the DC bias value in the form of a digital signal is obtained.

In the above solution, in the step B, before calculating the power value according to the voltage-related representative parameter, the DC bias value detected from the electrode of the discharge system and the DC bias controlling algorithm, the step B further includes:

converting the DC bias value in the form of a digital signal into a value that can participate in the calculation of the DC bias controlling algorithm.

In summary, in the device and the method for controlling the DC bias of the RF discharge system proposed by the present invention, because the mode selection module can receive the parameter and the type thereof which are input from the outside, and determine whether the power controlling method or the voltage controlling method should be used to control the DC bias by utilizing the judgment result of the type of the parameter, thereby a flexible choice between the two different kinds of DC bias controlling methods can be made, so that the object of compatibility can be achieved, and operations of process operators can be further advantaged.

DETAILED DESCRIPTION OF THE PREFERRED EMBODIMENTS

In order to make the objects, the technical solutions and the advantages clearer, the present invention will be further described below in detail with reference to the accompanying drawings and the particular embodiments.

Figure 3:
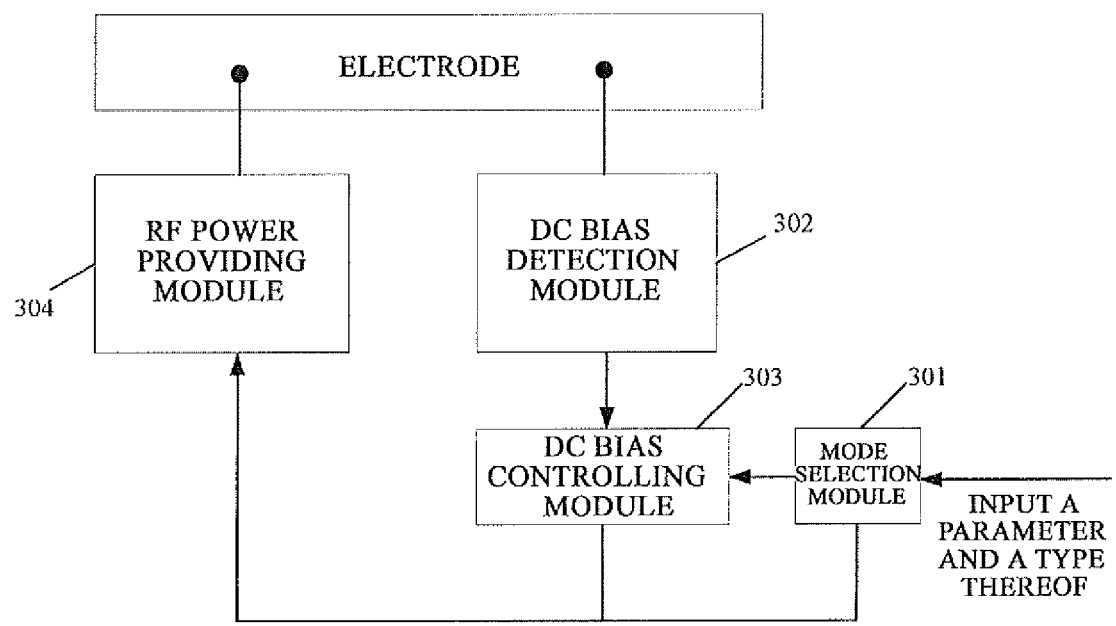
FIG. 3 is a schematic diagram of a device for controlling the DC bias according to the present invention.

FIG. 3 is a schematic diagram of a device for controlling the DC bias of a RF discharge system according to the present invention. As shown in FIG. 3, the device can include a mode selection module 301, a DC bias detection module 302, a DC bias controlling module 303 and a RF power providing module 304, wherein;

the mode selection module 301 is used for receiving input information including a parameter and the type of the parameter and judging the type of the parameter, and if the type of the parameter is representative of being related to power, outputting the parameter as a power-related representative parameter to the RF power providing module 304, if the type of the parameter is representative of being related to voltage, outputting the parameter as a voltage-related representative parameter to the DC bias controlling module 303.

The DC bias detection module 302 is used for detecting the DC bias of the electrode of the discharge system and outputting the detected DC bias value to the DC bias controlling module 303.

The DC bias controlling module 303 is used for receiving the voltage-related representative parameter from the mode selection module 301 and the DC bias value from the DC bias detection module 302, and calculating a power value according to a DC bias controlling algorithm by utilizing said DC bias value and the voltage-related representative parameter, and outputting the calculated power value to the RF power providing module 304.

The RF power providing module 304 is used for providing the electrode of the discharge system with power according to the power-related representative parameter upon receipt of the power-related representative parameter, and providing the electrode of the discharge system with power according to the power value calculated by the DC bias controlling module 303 upon receipt of the calculated power value.

Figure 1:
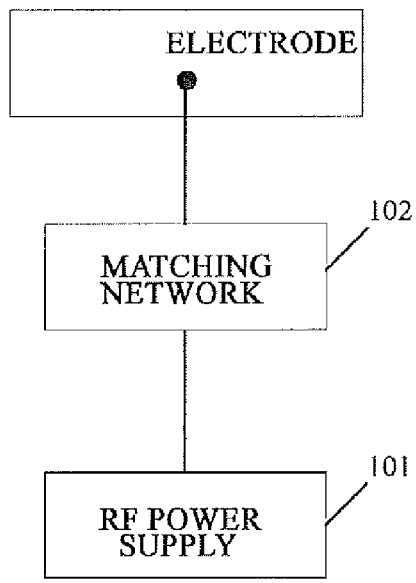
FIG. 1 is a FIG. 1 is a schematic diagram of a device for controlling the DC bias by utilizing the power controlling method in the prior art.
Figure 2:
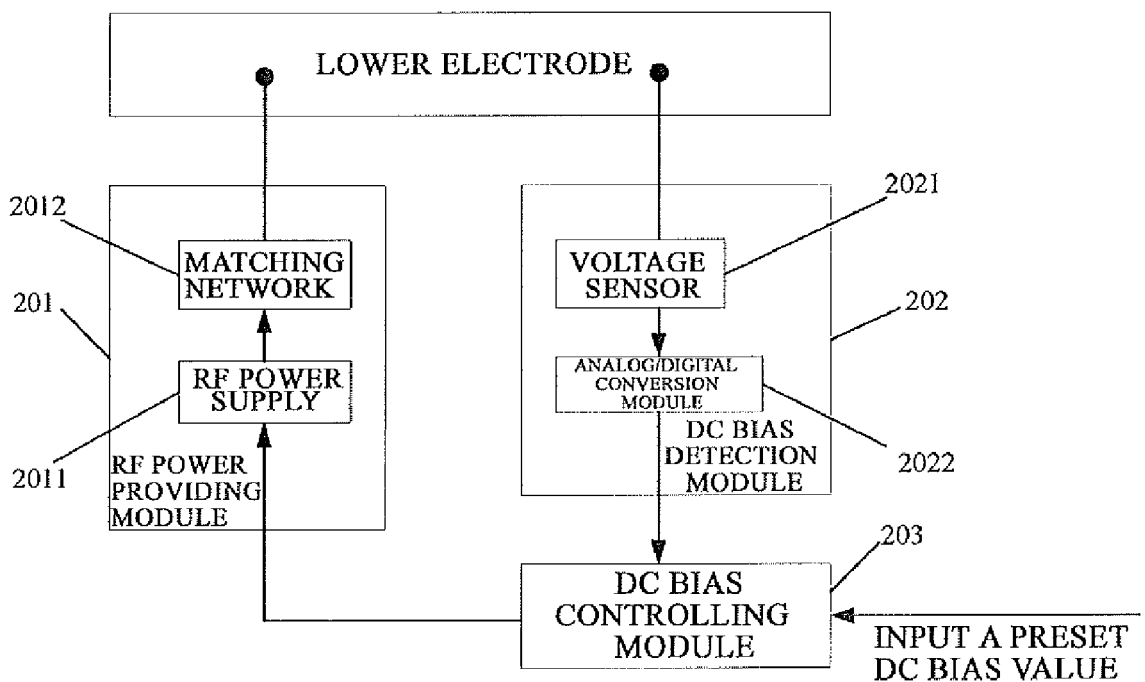
FIG. 2 is a schematic diagram of a device for controlling the DC bias by the voltage controlling method in the prior art.

That is, the device as shown in FIG. 3 can make the device utilizing the power controlling method in FIG. 1 and the device utilizing the voltage controlling method in FIG. 2 compatible. In particular, when the mode selection module 301 receives input information including a parameter and the type of the parameter, the type of the parameter can be judged, and if the type of the parameter is representative of being related to power, the parameter as a power-related representative parameter is output to the RF power providing module 304; if the type of the parameter is representative of being related to voltage, the parameter as a voltage-related representative parameter is output to the DC bias controlling module 303. The power-related representative parameter as described herein can be a preset power value, and said voltage-related representative parameter as described herein can be a preset voltage value or other value, as long as the DC bias controlling module 303 is enabled to calculate the corresponding power value.

On one hand, if the mode selection module 301 outputs the judged power-related representative parameter to the RF power providing module 304, the RF power providing module 304 can provide the electrode of the discharge system with power according to the power-related representative parameter. At this time, the device for controlling the DC bias as shown in FIG. 3 is equivalent to the device as shown in FIG. 1, and can provide the electrode of the discharge system with power by utilizing the power controlling method.

On the other hand, if the mode selection module 301 outputs the judged voltage-related representative parameter to the DC bias controlling module 303, the DC bias controlling module 303 can calculate a power value according to the voltage-related representative parameter, the DC bias value detected by the DC bias detection module 302 and a DC bias controlling algorithm, then output the calculated power value to the RF power providing module 304. The RF power providing module 304 provides the electrode of the discharge system with power according to the calculated power value. At this time, the RF power providing module 304, the electrode of the discharge system, the DC bias detection module 302 and the DC bias controlling module 303 in FIG. 3, which constitute a feedback loop, are equivalent to the device as shown in FIG. 2 and can provide the electrode of the discharge system with power by utilizing the voltage controlling method. The electrode of the discharge system as described herein can be the bottom electrode of the discharge system, or the top electrode of the discharge system.

It would be noted that the DC bias detection module 302 is in operational status regardless of whether the power controlling method or the voltage controlling method is used to provide the electrode of the discharge system with power. As such, if the power controlling method is used to provide the electrode of the discharge system with power, it is possible to cause a change in capacitance of the electrode of the discharge system due to the presence of the DC bias detection module 302, resulting in a small range of deviation in the process result.

In this case, if an accurate process result is required, the power-related representative parameter output to the RF power providing module 304 by the mode selection module 301 can be calibrated in advance, and the calibrated power-related representative parameter is then output to the RF power providing module 304, so that the process result achieved by the device as shown in FIG. 3 by utilization of the power controlling method is equivalent to that achieved by the device as shown in FIG. 1. Regarding how to calibrate the power-related representative parameter particularly, a detail description will be given in the particular embodiment as described below, and is omitted herein.

In addition, in the case of providing the electrode of the discharge system with power by utilizing the voltage controlling method, if an abnormal event occurs in the actual process environment, it will be very likely to result in an abnormal change in the DC bias. For example, if there is a wide range of fluctuation in pressure within a reaction chamber, an abnormal change in the DC bias will be caused. At this time, if the abnormal change in the DC bias can't be found in time, process operators can't take corresponding measures in time, resulting in failure of the entire process flow.

In order to find the abnormal change in the DC bias in time, it can be judged whether the power value calculated by the DC bias controlling module 303 exceeds the range of normal power values or not, after the power value is calculated by the DC bias controlling module 303. If the power value calculated by the DC bias controlling module 303 exceeds the range of normal power values, a fault alarm signal is output; otherwise, the calculated power value is output to said power providing module 304. The range of normal power values as described herein can be previously obtained by experiments. The details on how to obtain the range of normal power values can also refer to the particular embodiment as described below, and are omitted herein.

Figure 4:
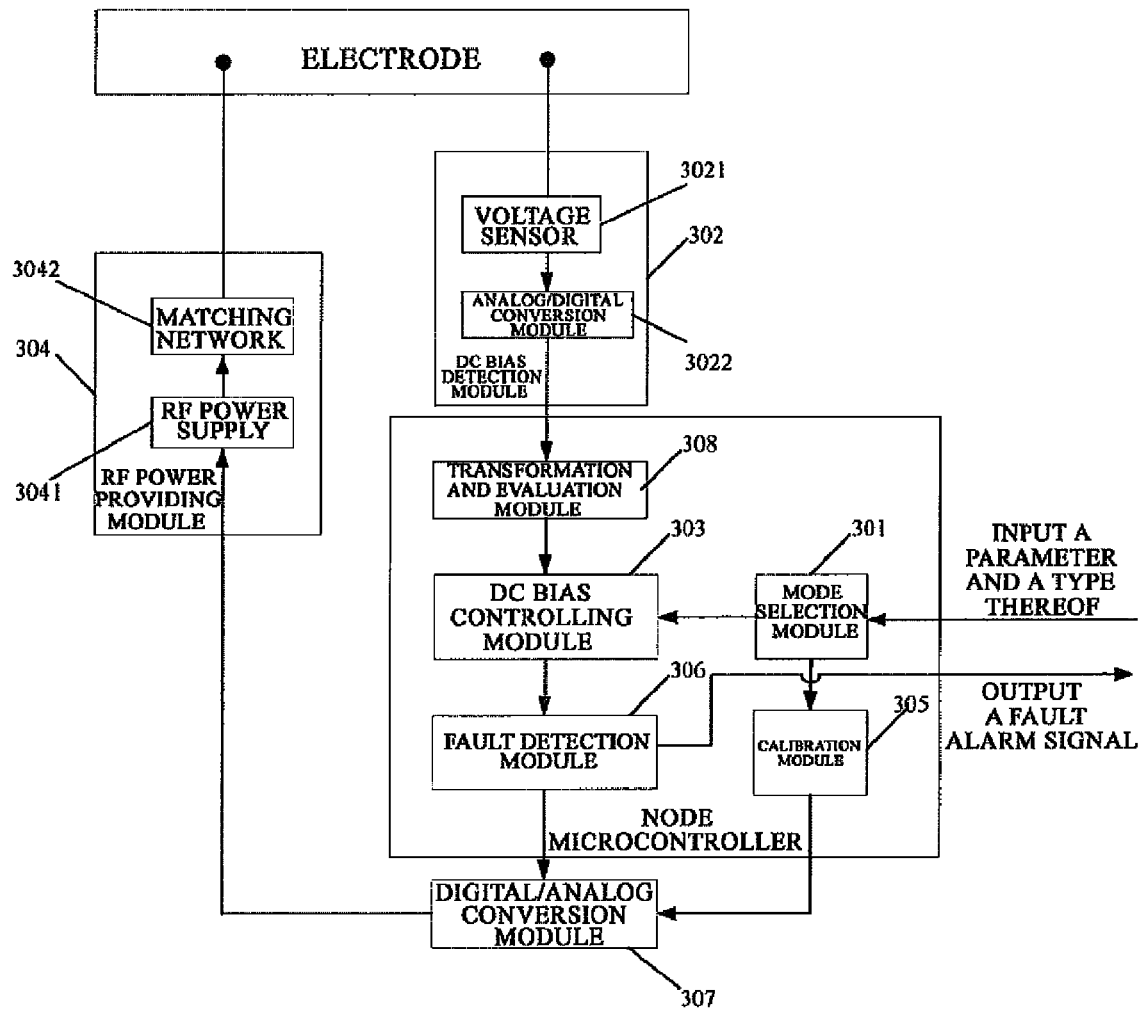
FIG. 4 is a schematic diagram of the structure of a device embodiment for controlling the DC bias according to the present invention.

In order to describe the solution of the present invention better, one device embodiment is described in detail below, FIG. 4 is a schematic diagram of the structure of the device embodiment. As shown in FIG. 4, the device of the preset embodiment includes not only the mode selection module 301, the DC bias detection module 302, the DC bias controlling module 303 and the RF power providing module 304, but also a calibration module 305, a fault detection module 306, a digital/analog conversion module 307 and a transform and evaluation module 308.

The functions of the mode selection module 301, the DC bias detection module 302, the DC bias controlling module 303 and the RF power providing module 304 are the same as those of the corresponding modules in FIG. 3. Wherein, the DC bias detection module 302 can include:

a voltage sensor 3021, for detecting the DC bias of the electrode of said discharge system and transmitting the detected DC bias value to an analog/digital conversion module 3022 in the form of an analog signal;

an analog/digital conversion module 3022, for converting the DC bias value in the form of an analog signal into a DC bias value in the form of a digital signal and outputting the DC bias value in the form of a digital signal to the transformation and evaluation module 308.

The RF power providing module 304 can include:

a RF power supply 3041, for providing power according to the power-related representative parameter upon receipt of the power-related representative parameter; and providing power according to the power value calculated by the DC bias controlling module 303 upon receipt of the calculated power value;

a matching network 3042, for matching with impedance of loads and outputting the power provided by the RF power supply 3041 to the electrode of the discharge system.

In addition, in the present embodiment, the calibration module 305 is used for storing the power calibration value obtained previously; updating the power-related representative parameter according to the power calibration value upon receipt of the power-related representative parameter from the mode selection module 301 and outputting the updated power-related representative parameter to the digital/analog conversion module 307.

When the power controlling method is utilized in the present embodiment, because the DC bias detection module 302 is still in operational status, it is possible to result in a deviation between the process result of the present embodiment and the process result of the device as shown in FIG. 1. In order to calibrate this deviation, the difference value between the power-related representative parameter and the actual power value by which the same process result is achieved can be checked firstly, and such difference value can be treated as the power calibration value.

In practice, the power calibration value can be determined by experiments. In the following, the method for determining the power calibration value is explained by an example of the etching velocity as a process parameter. Firstly, a certain process flow is carried out by utilizing the device as shown in FIG. 1, and the etching velocity is recorded. Then, the same process flow is carried out by utilizing the power controlling method implemented by the device as shown in FIG. 3, and the corresponding etching velocity is recorded, the power calibration value in the experiment herein can be initialized to be zero. If there is a difference between these two etching velocities, the actual power value is adjusted gradually, until the etching velocity reaches the corresponding etching velocity achieved by utilization of the device in FIG. 1. Thereafter, the difference value between the actual power value and the power-related representative parameter is stored in the calibration module 305 as the power calibration value. As such, after the calibration module 305 calibrates the received power-related representative parameter, the actual power value in the experiment, in turn, the expected etching velocity can be obtained. For example, if the power-related representative parameter is 500 W, and the required actual power value determined by the experiment is 510 W, then, 10 W can be previously stored in the calibration module 305. As such, upon receipt the power-related representative parameter of 500 W by the calibration module 305, the 10 W can be added, thus the power-related representative parameter is updated to 510 W and then output. Of course, in practice, there may be different power calibration values in different process flows, and the respective power calibration value of all the process flows can be obtained according to the above-described method and stored in the calibration module 305. Thereafter, the calibration module 305 obtains corresponding power calibration value according to the different process flow carried out, and updates the power-related representative parameter of the process flow according to the obtained power calibration value.

The fault detection module 306 is used for storing the range of normal power values obtained previously, and judging whether the power value calculated by the DC bias controlling module 303 exceeds the range of normal power values or not upon receipt of the calculated power value, and if so, outputting a fault alarm signal, otherwise, transmitting the calculated power value to the digital/analog conversion module 307.

The range of normal power values as described herein can be obtained by experiments as well, for example, when the process flow is carried out by utilizing the voltage controlling method in FIG. 3, the power value provided to the electrode of the discharge system in a normal process flow is recorded. After multiple experiments are made in the above-described manner, the maximum power value and the minimum power value recorded are stored in the fault detection module 306 as the range of normal power values.

The digital/analog conversion module 307 is used for performing digital-to-analog conversion on the digital signal carrying the power-related representative parameter, obtaining an analog signal carrying the power-related representative parameter, and outputting the analog signal carrying the power-related representative parameter to the RF power providing module 304; performing digital-to-analog conversion on the digital signal carrying the calculated power value, obtaining an analog signal carrying the calculated power value, and outputting the analog signal carrying the calculated power value to the RF power providing module 304.

The transformation and evaluation module 308 is used for converting the DC bias value in the form of a digital signal from the analog/digital conversion module 3022 into a value that can participate in the calculation of the DC bias controlling algorithm, and transmitting the converted DC bias value to the DC bias controlling module 303.

The transformation and evaluation module 308 as described herein can convert the value input from the analog/digital conversion module 3022 into a value that participates in the calculation of the DC bias controlling algorithm. For example, if the voltage sensor 3021 detect that the DC bias of the bottom electrode is 600V, an analog signal indicative of 600V is output to the analog/digital conversion module, and a digital signal indicative of 600V is then obtained after analog/digital conversion and is output to the transformation and evaluation module 308. If the DC bias controlling algorithm in the DC bias controlling module 303 requires that the parameter input should be an integer in the range of 0~65535, it is necessary for the transformation and evaluation module 308 to quantify the digital signal indicative of 600V into an integer in the range of 0~65535 and output it to the DC bias controlling module 303 for participation in the calculation. Of course, in this case, the voltage-related representative parameter input to the DC bias controlling module 303 by the mode selection module 301 should be an integer in the range of 0~65535 as well.

That is, the mode selection module 301 judges the type of the parameter upon receipt of input information including the parameter and the type of the parameter. If the type of the parameter is representative of being related to power, the parameter is output to the calibration module 305 as a power-related representative parameter, and if the type of the parameter is representative of being related to voltage, the parameter is output to the DC bias controlling module 303 as a voltage-related representative parameter. In the present embodiment, said power-related representative parameter can be a preset power value, said voltage-related representative parameter can be a preset voltage value or other values that can calculate the corresponding power. In the present embodiment, the electrode of the discharge system can be either the bottom electrode of the discharge system or the top electrode of the discharge system.

In the following, the processing procedure of the device of the present embodiment is explained in detail according to a case in which the parameter is the power-related representative parameter and a case in which the parameter is voltage-related representative parameter respectively.

On one hand, if the mode selection module 301 outputs the judged power-related representative parameter to the calibration module 305, the calibration module 305 updates the power-related representative parameter by utilizing the power calibration value stored previously and outputs the updated power-related representative parameter to the digital/analog conversion module 307; the digital/analog conversion module 307 converts the power-related representative parameter in the form of a digital signal into the power-related representative parameter in the form of an analog signal and outputs it to the RF power providing module 304; the RF power supply 3041 in the RF power providing module 304 provides power according to the power-related representative parameter, and the matching network 3042 outputs the power provided by the RF power supply 3041 to the electrode of the discharge system, so that the control of the DC bias by utilization of the power controlling method is achieved.

On the other hand, if the mode selection module 301 outputs the judged voltage-related representative parameter to the DC bias controlling module 303, the DC bias controlling module 303 can calculate the power value according to the voltage-related representative parameter, the DC bias value and the DC bias controlling algorithm. The DC bias value as described herein is the DC bias value detected from the electrode of the discharge system by the voltage sensor 3021. The DC bias value in an analog signal is input to the analog/digital conversion module 3022 for analog/digital conversion, and the DC bias value in the form of a digital signal is obtained. Then, the transformation and evaluation module 308 converts the DC bias value in the form of a digital signal into a value that can be used for the DC bias controlling algorithm, and outputs the value to the DC bias controlling module 303 for calculation. Thereafter, the fault detection module 306 judges whether the calculated power value exceeds the range of normal power values or not, and if so, outputs a fault alarm signal; otherwise, outputs the calculated power value to the digital/analog conversion module 307. The digital/analog conversion module 307 converts the power value in the form of a digital signal into a power value in the form of an analog signal upon receipt of the power value in the form of a digital signal, and outputs it to the RF power providing module 304; the RF power supply 3041 in the RF power providing module 304 provides power according to the calculated power value, and the matching network 3042 outputs the power provided by the RF power supply 3041 to the electrode of the discharge system, so that the control of the DC bias by the voltage controlling algorithm is achieved.

In the present embodiment, the RF power supply 3041 is a RF power supply that receives analog signals, thus when the fault detection module 306 outputs the power value calculated by the DC bias controlling module 303 to the RF power supply 3041, it is also necessary to perform conversion of digital signals into analog signals by utilizing the digital/analog conversion module 307. In practice, if the RF power supply 3041 is a RF power supply capable of receiving digital signals, it is not necessary to perform conversion of digital signals into analog signals, that is, the digital/analog conversion module 307 can be omitted.

In the present embodiment, when the DC bias detection module 302 outputs the DC bias value to the DC bias controlling module 303 for calculation, it is also required to convert the detected DC bias value into a value that can be used for the DC bias controlling algorithm. However, in practice, if the DC bias controlling algorithm can calculate by directly utilizing the DC bias value detected by the DC bias detection module 302, the transformation and evaluation module 308 can be omitted as well. Regarding the DC bias controlling algorithm as described herein, there are many algorithms, such as a neural net algorithm, a fuzzy controlling algorithm, a proportion-integration-differentiation (PID) algorithm, etc.

The mode selection module 301, the DC bias detection module 302, the DC bias controlling module 303, the RF power providing module 304 in the present embodiment are necessary, but the calibration module 305, the fault detection module 306, the digital/analog conversion module 307, the transformation and evaluation 308 and the like can be selected in accordance with the specific actual situations. For example, in the case that the RF power providing module 304 can receive a digital signal and the process flow does not require accurate control of the DC bias, the digital/analog conversion module 307 and the calibration module 305 may be unselected. Again for example, in the case that the RF power providing module 304 requires receipt of an analog signal, and the process flow requires an accurate control of the DC bias, but the system runs stably comparatively and doesn't need performing fault detection, the fault detection module 306 may be unselected. In short, the selectable modules in the present embodiment can be selected in accordance with the specific actual situations, and the specific actual situations are not exhausted herein.

In addition, in practice, it may also be required for the device in the present embodiment to communicate with outside, for example, the mode selection module 301 receives input information containing a parameter and the type of the parameter, and the fault detection module 306 outputs a fault alarm signal when judging that the power value exceeds the range of normal power values. In the present embodiment, the mode selection module 301, the DC bias controlling module 303, the calibration module 305, the fault detection module 306 and the transformation and evaluation module 308 can all be implemented by software programs, and can also be commonly referred to as a node microcontroller in practice. In this case, the node microcontroller can interact with outside by utilizing a certain communication interface, that is, the mode selection module 301 receives the input information via the communication interface, and the fault detection module 306 outputs a fault alarm signal via the communication interface. The outside as described herein can be a host computer connected to the node microcontroller, such as a personal computer, for communicating information with the node microcontroller.

Of course, the mode selection module 301, the DC bias controlling module 303, the calibration module 305, the fault detection module 306 and the transformation and evaluation module 308 can also be implemented by hardware, such as a analog circuit or a field programmable gate array (FPGA) and the like.

Figure 5:
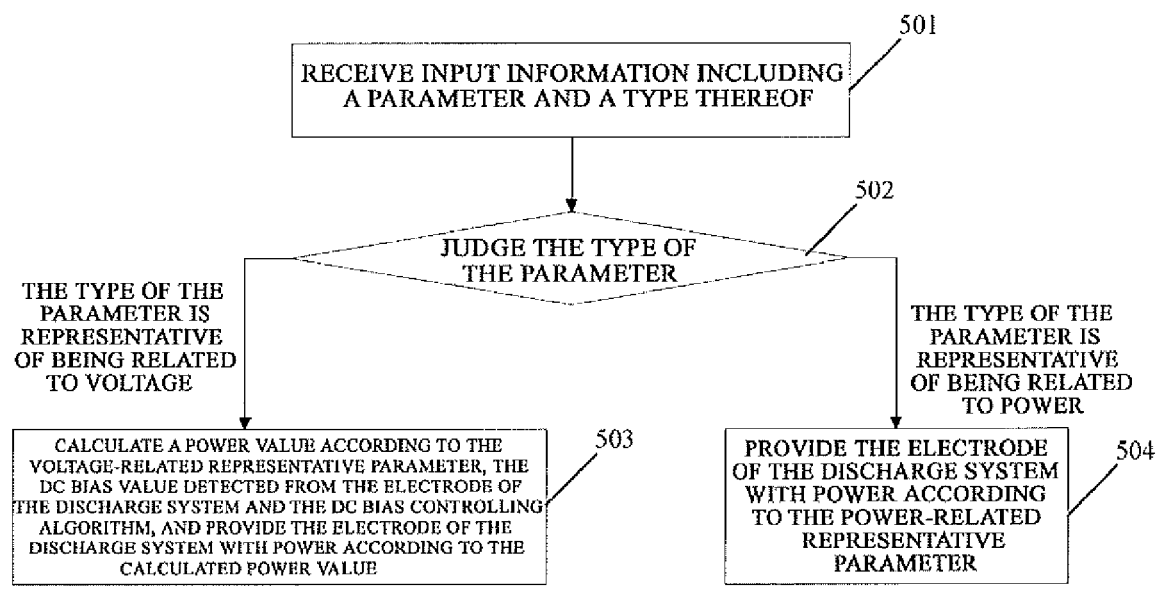
FIG. 5 is a flow chart of a method for controlling the DC bias according to the present invention.

With respect to the above-described device for controlling the DC bias of the RF discharge system, the present invention also provides a method for controlling the DC bias of the RF discharge system. FIG. 5 shows a flow chart of the method for controlling the DC bias of the RF discharge system according to the present invention. As shown in FIG. 5, said method can include:

Step 501: Input information including a parameter and the type of the parameter is received.

Step 502: The type of the parameter is judged, and if the type of the parameter is representative of being related to voltage, the parameter is treated as a voltage-related representative parameter, and step 503 is performed; if the type of the parameter is representative of being related to power, the parameter is treated as a power-related representative parameter, and step 504 is performed.

In practice, if the power-related representative parameter is required to be calibrated, between the judgment that the type of the parameter is representative of being related to power and the step 504, said method can further include: updating the power-related representative parameter according to the power calibration value stored previously. The power calibration value as described herein can be obtained by experiments, the method of which can refer to the description of the function and the principle of the above-described calibration module 305 and is omitted herein.

Step 503: A power value is calculated according to said voltage-related representative parameter, the DC bias value detected from the electrode of the discharge system and a DC bias controlling algorithm, and the electrode of the discharge system is provided with power according to the calculated power value.

In practice, if it is required to be informed in time when abnormal events occur in the DC bias, between the calculating the power value and the providing the electrode of the discharge system with power according to the calculated power value in the step 503, a step can be further included, in which it is judged whether the calculated power value exceeds the range of normal power values or not, and if so, a fault alarm signal is output and the present flow ends; otherwise, the step of providing the electrode of the discharge system with power according to the calculated power value is continued to be performed.

The range of normal power values as described herein can be previously obtained by experiments, the method of which can refer to the description of the function and the principle of the above-described fault detection module 306 and is omitted herein.

In addition, said method of providing the electrode of the discharge system with power according to the calculated power value in said step can specifically include: the RF power supply provides power according to the calculated power value, and the matching network for matching with impedance of loads outputs the power provided by the RF power supply to the electrode of the discharge system.

Step 504: The electrode of the discharge system is provided with power according to said power-related representative parameter.

Said method of providing the electrode of the discharge system with power according to the power-related representative parameter in said step can specifically include: the RF power supply provides power according to the power-related representative parameter, and the matching network for matching with impedance of loads outputs the power provided by the RF power supply to the electrode of the discharge system.

In order to explain the method for controlling the DC bias of the RF discharge system according to the present invention better, a method embodiment is explained in detail below.

FIG. 4 is a schematic diagram of the device corresponding to the present method embodiment, which includes the mode selection module 301, the DC bias detection module 302, the DC bias controlling module 303, the RF power providing module 304, the calibration module 305, the fault detection module 306, the digital/analog conversion module 307 and the transformation and evaluation module 308. Wherein, the DC bias detection module 302 includes the voltage sensor 3021 and the analog/digital conversion module 3022, and the RF power providing module 304 includes the RF power supply 3041 and the matching network 3042.

Figure 6:
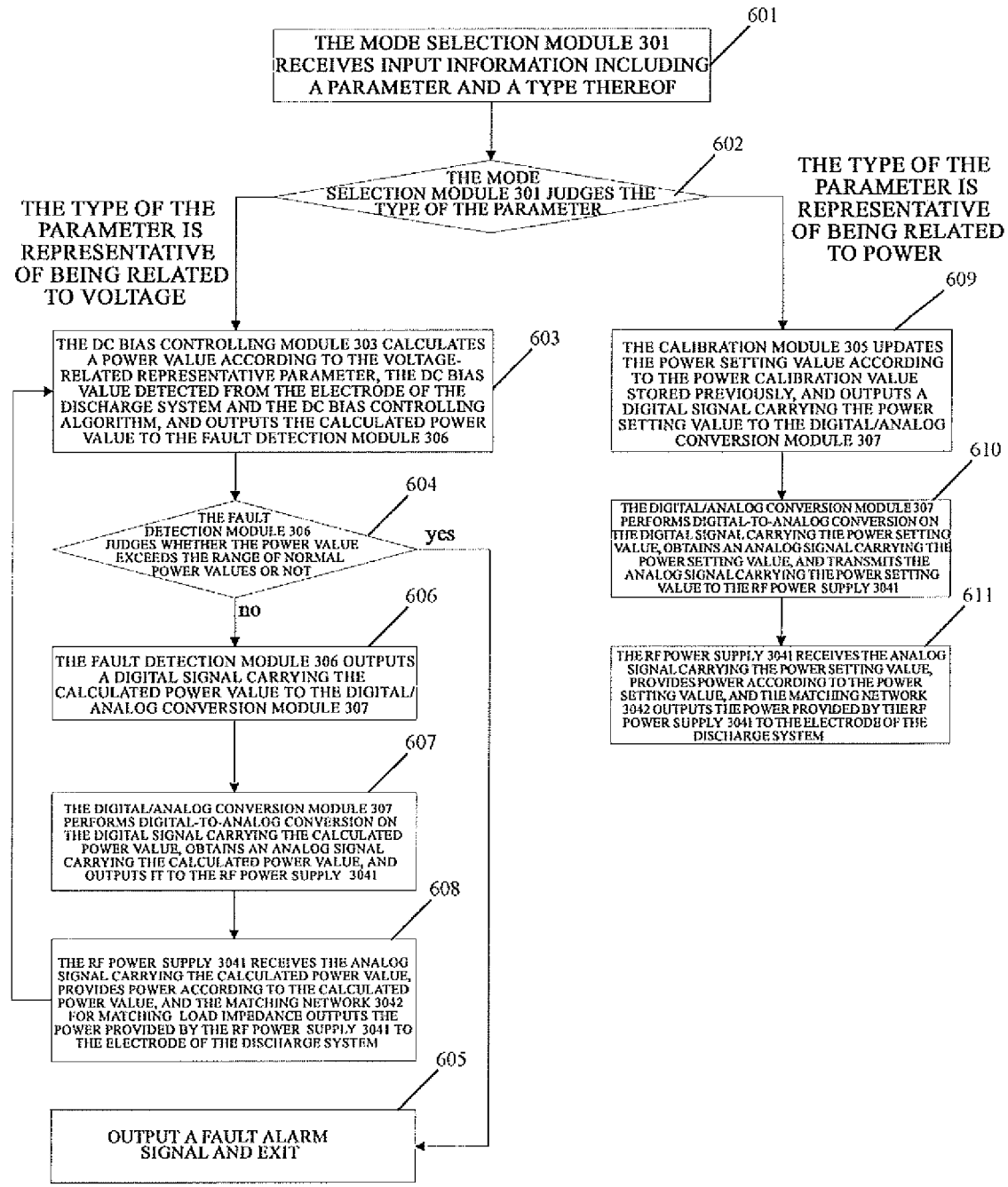
FIG. 6 is a flow chart of a method embodiment for controlling the DC bias according to the present invention.

FIG. 6 is a flow chart of the present method embodiment. As shown in FIG. 6, the present embodiment can include:

Step 601: the mode selection module 301 receives input information including a parameter and a type of the parameter.

Step 602: the model selection module 301 judges the type of the parameter, if the type of the parameter is representative of being related to voltage, the parameter is treated as a voltage-related representative parameter and step 603 is performed; if the type of the parameter is representative of being related to power, the parameter is treated as a power-related representative parameter and step 609 is performed.

Step 603: the DC bias controlling module 303 calculates a power value according to the voltage-related representative parameter, the DC bias value detected from the electrode of the discharge system and the DC bias controlling algorithm, and outputs the calculated power value to the fault detection module 306.

In practice, the method for detecting the DC bias value from the electrode of the discharge system can include: the voltage sensor 3021 detects the DC bias of the electrode of the discharge system and outputs the detected DC bias value in the form of an analog signal to the analog/digital conversion module 3022; the analog/digital conversion module 3022 performs analog-to-digital conversion, obtains the DC bias value in the form of a digital signal, and outputs it to the transformation and evaluation module 308; the transformation and evaluation module 308 converts the DC bias value in the form of a digital signal into a value that can be used for the DC bias controlling algorithm and outputs it to the DC bias controlling module 303. Of course, if the DC bias controlling algorithm allows the DC bias value in the form of a digital signal to directly participate in the calculation, it is not necessary to convert the DC bias value in the form of a digital signal into a value that can be used for the DC bias controlling algorithm by utilizing the transformation and evaluation module 308.

Step 604: the fault detection module 306 judges whether the calculated power value exceeds the stored range of normal power values or not, and if so, step 605 is performed; otherwise, step 606 is performed.

In practice, if the system runs stably comparatively and it is not necessary to detect whether the DC bias is abnormal or not, the steps 604-606 can be omitted.

Step 605: a fault alarm signal is output, and the present flow ends.

Step 606: the fault detection module 306 outputs the digital signal carrying the calculated power value to the digital/analog conversion module 307.

Step 607: the digital/analog conversion module 307 performs digital-to-analog conversion on the digital signal carrying the calculated power value, obtains an analog signal carrying the calculated power value and outputs the analog signal carrying the calculated power value to the RF power supply 3041.

In practice, if the RF power supply 3041 can receive digital signals directly, it is not necessary to perform digital-to-analog conversion by utilizing the digital/analog conversion module 307, that is, the step 607 can be omitted.

Step 608: the RF power supply 3041 receives the analog signal carrying the calculated power value and provides power according to the calculated power value, and the matching network 3042 for matching load impedance outputs the power provided by the RF power supply 3041 to the electrode of the discharge system; then the process returns to the step 603.

In present embodiment, the step 603 to the step 608 are a branch for controlling the DC bias by utilizing the voltage controlling method, and the DC bias detection module 302, the transformation and evaluation module 308, the DC bias controlling module 303, the fault detection module 306, the digital/analog conversion module 307, the RF power providing module 304 and the electrode of the discharge system as described herein, which can constitute a feedback loop, can perform the controlling calculation continuously according to the detected DC bias value and the voltage-related representative parameter, and maintain the electrode of the discharge system at the DC bias represented by the voltage-related representative parameter so as to achieve the object of controlling the DC bias by utilization of the voltage controlling method.

Step 609: the calibration module 305 updates the power-related representative parameter according to the power calibration value stored previously, and outputs the digital signal carrying the power-related representative parameter to the digital/analog conversion module 307.

In practice, if the power controlling method is used, there is a small range of deviation in the process result due to the introduction of the voltage sensor 3021. But if the process result is not required to be very exact, there is no need to use the calibration module 305 to calibrate the power-related representative parameter, that is, the step 609 can be omitted.

Step 610: the digital/analog conversion module 307 performs digital-to-analog conversion on the digital signal carrying the power-related representative parameter, obtains an analog signal carrying the power-related representative parameter, and outputs the analog signal carrying the power-related representative parameter to the RF power supply 3041.

In practice, if the RF power supply 3041 can receive the digital signal directly, it is not necessary to perform digital-to-analog conversion by utilizing the digital/analog conversion module 307, that is, the step 610 can be omitted.

Step 611: the RF power supply 3041 receives the analog signal carrying the power-related representative parameter, provides power according to the voltage-related representative parameter, and the matching network 3042 outputs the power provided by the RF power supply 3041 to the electrode of the discharge system.

In the application of the solution of the present invention, because the mode selection module 301 can receive the parameter and the type of the parameter input outside, and determine whether the power controlling method or the voltage controlling method should be used to control the DC bias by use of the judgment result of the type of the parameter, the flexible selection between the two different methods for controlling the DC bias can be enabled, the object of compatibility can be achieved, and operations of process operators can be further advantaged.

In conclusion, the above embodiments are only the preferred embodiments, and not for limiting the protection scope of the present invention. Any modification, equivalent substitution, improvement or the like falling within the sprits and the scopes of the present invention shall all be incorporated into the protection scope of the present invention.

What is claimed as new and desired to be protected by Letters Patent of the United States is:

1. A device for controlling a DC bias of a RF discharge system, characterized in that the device comprises a mode selection module, a DC bias detection module, a DC bias controlling module and a RF power providing module;

said mode selection module is used for receiving input information including a parameter and a type of the parameter; judging the type of the parameter, and if the type of the parameter is representative of being related to power, outputting the parameter as a power-related representative parameter to the RF power providing module; if the type of the parameter is representative of being related to voltage, outputting the parameter as a voltage-related representative parameter to the DC bias controlling module;

said DC bias detection module is used for detecting the DC bias of an electrode of the discharge system and outputting a detected DC bias value to the DC bias controlling module;

said DC bias controlling module is used for receiving the voltage-related representative parameter from the mode selection module and the DC bias value from the DC bias detection module; calculating a power value according to a DC bias controlling algorithm by utilizing said DC bias value and said voltage-related representative parameter, and outputting the calculated power value to the RF power providing module;

said RF power providing module is used for providing the electrode of the discharge system with power according to the power-related representative parameter upon receipt of the power-related representative parameter from the mode selection module; and providing the electrode of the discharge system with power according to the power value calculated by the DC bias controlling module upon receipt of the calculated power value.

2. The device according to claim 1, characterized in that the device further comprises:

a calibration module, positioned between said mode selection module and said RF power providing module, for storing a power calibration value obtained previously; updating the power-related representative parameter according to said power calibration value upon receipt of the power-related representative parameter from said mode selection module, and outputting the updated power-related representative parameter to said RF power providing module.

3. The device according to claim 1, characterized in that the device further comprises:

a fault detection module, positioned between said DC bias controlling module and the RF power providing module, for storing a range of normal power values obtained previously; judging whether the power value calculated by the DC bias controlling module exceeds the range of the normal power values or not upon receipt of the calculated power value, and if so, outputting a fault alarm signal; otherwise, outputting the calculated power value to said RF power providing module.

4. The device according to claim 3, characterized in that said RF power providing module comprises:

a RF power supply, for providing power according to the power-related representative parameter upon receipt of the power-related representative parameter; and providing power according to the power value calculated by the DC bias controlling module upon receipt of the calculated power value;

a matching network, for matching load impedance and outputting the power provided by the RF power supply to the electrode of the discharge system.

5. The device according to claim 4, characterized in that the RF power supply is a RF power supply that receives analog signals, the power-related representative parameter output to the RF power supply is carried in a digital signal, and the calculated power value output to the RF power supply is carried in a digital signal, and the device further comprises:

a digital/analog conversion module, for performing digital-to-analog conversion upon receipt of the digital signal carrying the power-related representative parameter, obtaining an analog signal carrying the power-related representative parameter and outputting the analog signal carrying the power-related representative parameter to the RF power supply; performing digital-to-analog conversion upon receipt of the digital signal carrying the calculated power value, obtaining an analog signal carrying the calculated power value and outputting the analog signal carrying the calculated power value to the RF power supply.

6. The device according to claim 4, characterized in that said DC bias detection module comprises:
- a voltage sensor, for detecting the DC bias of said electrode of the discharge system and outputting the detected DC bias value in the form of an analog signal to an analog/digital conversion module;
- the analog/digital conversion module, for converting the DC bias value in the form of an analog signal into a DC bias value in the form of a digital signal and outputting the DC bias value in the form of a digital signal to said DC bias controlling module.

7. The device according to claim 6, characterized in that the device further comprises:
- a transformation and evaluation module, for receiving the DC bias value in the form of a digital signal from the analog/digital conversion module, converting the received DC bias value into a value that can participate in the calculation of the DC bias controlling algorithm, and outputting the converted DC bias value to the DC bias controlling module.

8. A method for controlling a DC bias of a RF discharge system, characterized in that the method includes:
- A. receiving input information including a parameter and a type of the parameter and judging the type of the parameter, if the type of the parameter is representative of being related to voltage, treating the parameter as a voltage-related representative parameter and performing step B; if the type of the parameter is representative of being related to power, treating the parameter as a power-related representative parameter and performing step C;
- B. calculating a power value according to said voltage-related representative parameter, the DC bias value detected from the electrode of the discharge system and a DC bias controlling algorithm, and providing the electrode of the discharge system with power according to the calculated power value;
- C. providing the electrode of the discharge system with power according to said power-related representative parameter.

9. The method according to claim 8, characterized in that between judging that the type of the parameter is representative of being related to power in the step A and the step C, the method further includes:
- updating said power-related representative parameter according to a power calibration value stored previously.

10. The method according to claim 8, characterized in that in the step B, between calculating the power value and providing the electrode of the discharge system with power according to the calculated power value, the method further includes:
- judging whether the calculated power value exceeds the range of normal power values stored previously or not, and if so, outputting a fault alarm signal and exiting the present flow; otherwise, continuing performing the step of providing the electrode of the discharge system with power according to the calculated power value.

11. The method according to claim 10, characterized in that said providing the electrode of the discharge system with power according to the calculated power value in the step B particularly includes: a RF power supply provides power according to the calculated power value, and a matching network for matching load impedance outputs the power provided by the RF power supply to the electrode of the discharge system;
- said providing the electrode of the discharge system with power according to the power-related representative parameter in the step C particularly includes: the RF power supply provides power according to said power-related representative parameter, and the matching network for matching load impedance outputs the power provided by the RF power supply to the electrode of the discharge system.

12. The method according to claim 11, characterized in that said RF power supply is a RF power supply that receives analog signals, said calculated power value is carried in a digital signal, said power-related representative parameter is carried in a digital signal, and in the step B, between judging that the calculated power value does not exceed the range of power values stored previously and providing the electrode of the discharge system with power according to the calculated power value, the method further includes:
- performing digital-to-analog conversion on a digital signal carrying the calculated power value, obtaining an analog signal carrying the calculated power value, and outputting the analog signal carrying the calculated power value to the RF power supply;
- before said providing the electrode of the discharge system with power according to the power-related representative parameter in the step C, the method further includes:
- performing digital-to-analog conversion on a digital signal carrying the power-related representative parameter, obtains an analog signal carrying the power-related representative parameter, and outputs the analog signal carrying the power-related representative parameter to the RF power supply.

13. The method according to claim 11, characterized in that said detecting the DC bias value from the electrode of the discharge system particularly includes:
- a voltage sensor detects the DC bias of the electrode of the discharge system, an analog-to-digital conversion is performed on the detected DC bias value in the form of an analog signal, and the DC bias value in the form of a digital signal is obtained.

14. The method according to claim 13, characterized in that before calculating the power value according to the voltage-related representative parameter, the DC bias value detected from the electrode of the discharge system and the DC bias controlling algorithm in the step B, the step B further includes:
- converting the DC bias value in the form of a digital signal into a value that can participate in the calculation of the DC bias controlling algorithm.

* * * * *